July 11, 1961 F. W. DEHMELT 2,992,144
METHOD OF FORMING TRANSISTORS
Filed May 29, 1959
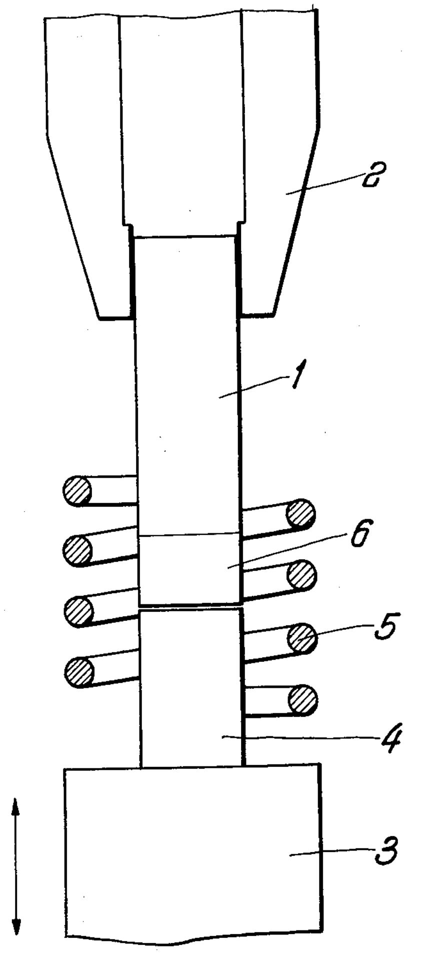
Inventor:
Friedrich W. Dehmelt
By [signature] Patent Agent United States Patent Office 2,992,144

Patented July 11, 1961

2,992,144
METHOD OF FORMING TRANSISTORS

Friedrich Wilhelm Dehmelt, Neu-Ulm (Danube), Germany, assignor to Telefunken G.m.b.H., Berlin, Germany Filed May 29, 1959, Ser. No. 816,790
Claims priority, application Germany June 4, 1958
7 Claims. (Cl. 148—1.5)

This invention relates to a method of manufacturing electrical translators and more specifically to the production of silicon transistors.

There is a basic difference between alloyed junction transistors and grown junction transistors. In the case of silicon as the semi-conductor material, the methods now preferred result in grown transistors. Such a method is, for example, the so-called "rate-grown method" in which the desired doping for the semi-conductor crystal is obtained by varying the drawing velocity. A method has recently been developed called "grown-diffused method." This method starts first with a silicon melt to which an n-type impurity is added. A silicon crystal is obtained by introducing a seed crystal into the melt and gradually withdrawing it therefrom in a conventional manner. In order to obtain an n-p-n transistor, the drawing step is interrupted after completion of the collector region and p-type doping material is added to the melt, said melt having now both p- and n-impurities. The composition of the doping material is selected in such a manner that the silicon melt as a whole retains n-conductive characteristics. The required p-type base layer is obtained by diffusion of p-impurities from the silicon melt into a section of the already drawn semi-conductor collector crystal adjacent the melt, rather than by drawing additional silicon from the melt. This method of obtaining the p-type region is based upon the fact that by properly choosing the n and p materials the diffusion velocity of p-impurities may be made to exceed by far that of the n-impurities. Therefore, even though the base layer contains both p and n type impurities, the p-type impurities predominate. After preparation of the diffused base layer adjacent the collector region, renewed drawing operations result in the formation of the n-conductivity emitter.

A disadvantage of the aforesaid method resides in the fact that with this and related crystal growing techniques relatively small yields are obtained. The silicon melt can not be permitted to solidify in the crucible, because it would destroy the latter. Thus it is customary to continue the drawing process, until the silicon melt is used up, even though a relatively large segment of the emitter region thus obtained must be removed from the crystal and discarded.

A further disadvantage of these materials is that the preparation of several n-p-n layer sequences from a single melt is not feasible, because the repeated impurity applications required would add too much foreign matter to the semi-conductor material. Ultimately a large portion of the drawn crystals would not be usable for the intended purpose.

A general object of the present invention is to provide an improved method of making p-n junctions in semi-conductive material.

It is a further object of the present invention to provide a method of forming grown junction transistors in which no crucible is used and whereby two semi-conductor crystals of the same conductivity type and of corresponding conductivity are fused to one another to result in the desired junction.

Briefly, the instant invention contemplates providing two semi-conductor crystals of the same conductivity type, at least one of which is appropriately doped with both donors and acceptors. The n- and p-type impurities are chosen such that the diffusion rate of the type opposite to the conductivity type of the crystals has a higher diffusion rate than the other conductivity type impurity. The two crystals are brought into contact with one another and the region of contact is heated to the fusion temperature of the material.

The fusion temperature of the crystals is maintained, until the two starting crystals are fused together and further until a diffusional boundary layer of a conductivity type opposite to that of the original crystals having a desired thickness is formed at the junction between the two zones of the same conductivity type.

It is a still further object of the instant invention to control the subsequent cooling step in such a manner that recrystallization on solidification causes the monocrystalline structure of a unitary crystal.

The invention will be explained in detail by way of an example. First, a semi-conductor crystal is drawn from an n-conductive silicon melt which is doped in such a manner that for the drawn crystal the conductivity desired for the collector is obtained. If, for example, the collector crystal shall be of the n-conductivity type and shall have a conductivity of 35 Ωcm., this result can be obtained by adding to the silicon melt, while considering the disassociation factor, about $6 \times 10^{15}$ antimony atoms per $cm.^3$ of silicon melt. Alternatively arsenic may be employed. Doping of the likewise n-conductive silicon melt, from which the emitter crystal is to be prepared, is carried out in such a manner that in addition to the n-impurities determining the n-conductivity character, there are added p-impurities which later diffuse from the emitter into the collector crystal to form a p-conductive base or boundary layer. For this purpose appropriate n- and p-impurities are added to the emitter silicon melt. Specifically a suitable emitter conductivity is obtained by overdoping with As or Sb to the extent necessary to overcome the effect of the p-type impurity on the conductivity of the crystal.

A p-impurity is employed, the diffusion velocity of which is substantially higher than the diffusion velocity of the n-impurity controlling conductivity of the crystal as a whole.

It is to be noted that the diffusion velocity is dependent upon the diffusion coefficient of the impurities and also upon their concentrations. In the example when 0.2 Ωcm. n-conductivity is desired for the emitter, the diffusion velocity of the p-impurities should be about twenty times larger than the diffusion velocity of the n-impurities. With the use of aluminum for p-impurity, $1.5 \times 10^{17}$ Al-atoms are necessary, if simultaneously $6 \times 10^{17}$ Sb-atoms are added both per $cm.^3$ of melt. The silicon crystal drawn from this melt has the desired n-conductivity of 0.2 Ωcm. Since the drawn crystals are relatively large, the emitter crystals and the collector crystal are each suitably subdivided into small crystal rods of final shape and size for assembly of a number of transistors according to the technique described below.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

The drawing illustrates schematically how the process according to the invention can be carried out.

A small collector crystal rod 1 obtained in the manner described above is clamped in a fixed quartz support 2. A movable quartz rod 3 is mounted opposite the quartz support 2 and an emitter plate or crystal 4 obtained in the manner described above is placed on the quartz rod 3. Upward movement of rod 3 will cause the end of emitter 4 to be brought into engagement with the adjacent end of small collector crystal rod 1. A heating coil 5 is provided to heat the end of emitter plate 4 and if desired the adjacent end of collector rod 1 to the melting temperature of 1420° C. for about 8 minutes, whereby fusion of the two crystal pieces and diffusion of the p-impurities from the emitter plate 4 into the collector rod 1 both occur. Although the n-impurities will also diffuse, p-impurities diffusion is predominant due to the substantially higher p-impurity diffusion rate, whereby a p-boundary layer 6 serving as base is formed as a result of the p-impurity diffusion. After a base region of suitable thickness is obtained, the entire structure is cooled at such a rate as to insure the formation of a single crystal body.

Although in the example given above, the p-type impurity is initially added to the emitter crystal, it is not intended to limit the scope of the invention to such a procedure, since the p-type impurity may be initially added to the collector crystal. In such a case, the collector crystal must be overdoped with n-type impurities to compensate for the effect of p-type impurities on the conductivity of this crystal. Also, the invention contemplates the formation of p-n-p transistors by employing p-type crystals at least one of which is doped with an n-type impurity having a higher diffusion rate than the p-type impurities employed.

The new process is very simple and also suitable for automation. The large wear and tear and uneconomical operation which heretofore had to be taken into account has been overcome by the method of the instant invention.

What is claimed is:

1. The method of making a composite transistor crystal comprising first and second zones of one conductivity type spaced apart and joined to a third zone of opposite conductivity type, including the following steps: making a first-zone crystal substantially uniformly doped to have said one conductivity type; making a second-zone crystal more heavily doped with a first impurity of said one conductivity type and also doped with a second impurity of said opposite conductivity type added in a quantity insufficient to reverse said one conductivity type of the second-zone crystal, said impurities being substantially uniformly distributed therethrough and the second impurity having a diffusion constant which is large as compared with that of said first impurity; and fusing said first and second zone crystals together at a temperature and for a time of heating sufficient for some of said second impurity to diffuse partway into the adjacent first-zone crystal and form said third zone wherein the diffused second impurity is present in quantity sufficient to reverse the conductivity within said third zone to said opposite type.

2. A method according to claim 1, wherein individual emitter and collector rods are cut from the first two zones crystals to the final thickness required for a finished transistor crystal prior to the fusing step.

3. A method according to claim 1, wherein the rate of cooling is controlled to insure that recrystallization results in a monocrystalline structure.

4. A method according to claim 1, wherein the first-zone and second-zone crystals comprising the emitter and collector are made of silicon.

5. A method according to claim 1, wherein the first and second zone crystals are n-conductive silicon.

6. A method according to claim 4, wherein doping of the emitter crystal is accomplished by an impurity selected from the group consisting of arsenic and antimony.

7. A method according to claim 4, wherein p-doping of the n-conductive emitter crystal is accomplished by an aluminum impurity and an overdoping of said crystal with n-impurity is effected with an impurity selected from the group consisting of arsenic and antimony.

References Cited in the file of this patent

UNITED STATES PATENTS

| | | |
|---|---|---|
| 2,701,326 | Pfann et al. | Feb. 1, 1955 |
| 2,793,145 | Clarke | May 21, 1957 |